(12) United States Patent
Schuisky et al.

(10) Patent No.: US 7,989,077 B2
(45) Date of Patent: Aug. 2, 2011

(54) METAL STRIP PRODUCT

(75) Inventors: Mikael Schuisky, Sandviken (SE);
Magnus Cedergren, Sandviken (SE)

(73) Assignee: Sandvik Intellectual Property AB, Sandviken (SE)

( * ) Notice: Subject to any disclaimer, the term of this patent is extended or adjusted under 35 U.S.C. 154(b) by 832 days.

(21) Appl. No.: 10/567,122

(22) PCT Filed: Aug. 9, 2004

(86) PCT No.: PCT/SE2004/001173
§ 371 (c)(1),
(2), (4) Date: May 20, 2008

(87) PCT Pub. No.: WO2005/015645
PCT Pub. Date: Feb. 17, 2005

(65) Prior Publication Data
US 2008/0257404 A1    Oct. 23, 2008

(30) Foreign Application Priority Data

Aug. 12, 2003   (SE) .................................... 0302206

(51) Int. Cl.
*H01L 31/00* (2006.01)
(52) U.S. Cl. ......................... 428/469; 136/262
(58) Field of Classification Search .................. None
See application file for complete search history.

(56) References Cited

U.S. PATENT DOCUMENTS

| | | | | |
|---|---|---|---|---|
| 5,112,704 A | * | 5/1992 | Furukawa et al. | ............ 429/330 |
| 5,187,033 A | * | 2/1993 | Koshiba | ................... 429/231.1 |
| 5,994,163 A | | 11/1999 | Bodegard et al. | |

FOREIGN PATENT DOCUMENTS

| | | |
|---|---|---|
| DE | 100 24 882 A1 | 11/2001 |
| WO | WO 03/007386 A1 | 1/2003 |

OTHER PUBLICATIONS

K. Herz et al., "Diffusion barriers for CIGS solar cells on metallic substrates", Thin Solid Films, 431-432, pp. 392-397 (2002).
K. Granath et al., "The effect of NaF on Cu(In, Ga)Se$_2$ thin film solar cells", Solar Energy Materials & Solar Cells, 60, pp. 279-293 (2000).
T. Satoh et al., "Cu(In,Ga)Se2 solar cells on stainless steel substrates covered with insulating layers", Solar Energy Materials & Solar Cells, 75, pp. 65-71 (2003).
K. Herz et al., "Dielectric barriers for flexible CIGS solar modules", Thin Solid Films, 403-404, pp. 384-389 (2002).
Bülent M. Basol et al., "Flexible and Light Weight Copper Indium Diselenide Solar Cells", IEEE, pp. 157-162 (1996).
K. Granath, "The Influence of Na on the Growth of Cu(In,Ga) Se$_2$ Layers for Thin Film Solar Cells", Acta Universitatis Upsaliensis, Comprehensive Summaries of Uppsala Dissertations from the Faculty of Science and Technology 491, ISBN 91-554-4591-8, (1999).

* cited by examiner

*Primary Examiner* — Jennifer K. Michener
*Assistant Examiner* — Magali P Slawski
(74) *Attorney, Agent, or Firm* — Drinker Biddle & Reath LLP

(57) ABSTRACT

A coated steel product comprises a metallic strip material which has a coating comprising an electrically insulating layer doped with sodium. The thermal expansion coefficient of said metallic strip material is less than $12 \times 10^{-6}$ K$^{-1}$ in the temperature range 0-600° C. Said product may be coated with an electrically conducting layer of molybdenum. The coated steel product is useful as a substrate for flexible Cu(In,Ga)Se$_2$ (CIGS) solar cells.

21 Claims, 4 Drawing Sheets

METAL STRIP PRODUCT

RELATED APPLICATION DATA

This application is a national stage application filed under §371 of International Application PCT/SE2004/001173 filed on Aug. 9, 2004, which claims the benefit of priority to application SE 0302206-8 filed Aug. 12, 2003. The entire disclosure of each of the prior applications is considered as being part of the disclosure of the present application and is hereby incorporated by reference therein.

FIELD

The present disclosure relates generally to a coated metallic substrate material suitable for manufacturing of flexible solar cells and a method of manufacturing of a metal oxide coated metal strip product in a roll-to-roll process. This is achieved by coating a metallic strip with an electrically insulating inner layer and also optionally with an electrically conducting surface layer.

BACKGROUND

In the discussion of the background that follows, reference is made to certain structures and/or methods. However, the following references should not be construed as an admission that these structures and/or methods constitute prior art. Applicant expressly reserves the right to demonstrate that such structures and/or methods do not qualify as prior art.

The most common substrate material used today by manufacturers of thin film $Cu(In,Ga)Se_2$ (abbreviated CIGS) solar cells is sodalime glass. Two examples of solar cells with glass substrates are DE-A-100 24 882 and U.S. Pat. No. 5,994,163. A positive effect by the use of sodalime glass is an increased efficiency of the solar cell, due to the diffusion of an alkali metal (primarily sodium) from the glass into the CIGS layer. This fact is known from, e.g., the Thesis by Karin Granath (1999): The Influence of Na on the Growth of $Cu(In,Ga)Se_2$ Layers for Thin Film Solar Cells, Acta Universitatis Upsaliensis, Comprehensive Summaries of Uppsala Dissertations from the Faculty of Science and Technology 491, Uppsala ISBN 91-554-4591-8, hereby incorporated into the present disclosure by this reference. However, the batch-like production of CIGS on glass substrates is expensive and, therefore, it is an advantage to use roll-to-roll production of solar cells, which lowers the production cost. Moreover, there are several technical advantages with flexible solar cells produced by a roll-to-roll process, for instance, the flexible solar cells can be folded or rolled into compact packages and they may be used for making light weight solar cells, which is desirable for portable, spatial and military applications.

Several materials have been tested as substrate materials for flexible CIGS solar cells, including polymers such as polyimide and metals such as molybdenum, aluminium and titanium foils, bearing in mind that they all have to fulfill certain criteria. Thus, the substrate material should be thermally resistant in order to withstand further process steps in the production of thin film flexible CIGS solar cells, and this may include heat treatments at temperatures up to 600° C. under corrosive atmosphere. The flexible metallic substrate should be insulated from the electrical back contact if CIGS modules with integrated series connections are to be produced. Therefore, it is essential that the thermal expansion coefficient (TEC) of the substrate material should be as close as possible to the TEC of the electrical insulating metal oxide layer(s) to avoid thermal cracking or spallation of the insulating metal oxide layer. Common conventional substrate materials for the production of CIGS solar cells are:

Using sodalime glass substrates in batch-like processes;
Depositing a molybdenum back contact material directly onto the metal strip that constitutes the substrate;
Depositing insulating silicon oxide ($SiO_x$ or $SiO_2$) layers onto metal strips in batch type deposition processes.

One example of known solar cells are disclosed in Thin Solid Films 403-404 (2002) 384-389 by K. Herz et al.: "Dielectric barriers for flexible CIGS solar modules", hereby incorporated into the present disclosure by this reference. According to this article, excellent electrical insulation for the preparation of CIGS solar modules was obtained on metal substrates by using $SiO_x$ and/or $Al_2O_3$ barrier layers. However, due to the lack of sodium, the voltage produced by the solar cell was inferior.

A further example of known solar cells making use of stainless steel substrates are disclosed in Solar Energy Materials & Solar Cells 75 (2003) 65-71 by Takuya Satoh et al.: "$Cu(In,Ga)Se_2$ solar cells on stainless steel substrates covered with insulating layers", hereby incorporated into the present disclosure by this reference. However, according to this article, the CIGS solar cells on the stainless steel decreased open-circuit voltage compared with that on the soda-lime glass substrates.

Moreover, in WO 03/007386 (hereby incorporated into the present disclosure by this reference) a thin-film solar cell is described. It comprises a flexible metallic substrate having a first surface and a second surface. A back metal contact layer is deposited on the first surface of the flexible metallic substrate. A semiconductor absorber layer is deposited on the back metal contact. A photoactive film deposited on the semiconductor absorber layer forms a heterojunction structure and a grid contact deposited on the heterojunction structure. The flexible metal substrate can be constructed of either aluminum or stainless steel. Furthermore, a method of constructing a solar cell is disclosed. This method comprises providing an aluminum substrate, depositing a semiconductor absorber layer on the aluminum substrate, and insulating the aluminum substrate from the semiconductor absorber layer to inhibit reaction between the aluminum substrate and the semiconductor absorber layer. Although this known solar cell works satisfactorily, it does not attain the open-voltage level of a solar cell with a soda-lime glass substrate because of the lack of sodium doping.

Thus, all these conventional methods have their respective disadvantages. All processes based on batch-type production will always increase the cost and it is therefore essential that the production will be on a roll-to-roll process to decrease the cost.

Hence, when using sodalime glass, it is impossible to produce flexible CIGS, and the batch-type process is expensive. Further, the deposition of Mo back contact directly onto the flexible metal strip substrate will limit the production of CIGS modules with integrated series connections. Furthermore, the $SiO_x$ or $SiO_2$ insulating layers have a too low TEC, which may lead to the formation of cracks and pinholes during the following process steps. Moreover, by not adding an alkali metal in the $SiO_2$ layer, it (primarily sodium) has to be added in a later production step if higher efficiency CIGS is to be produced. The addition of one or more process steps in a production line is always associated with extra costs.

SUMMARY

The present application discloses a flexible and light metallic substrate for solar cell production with a thermal expansion coefficient as similar as possible to the insulating metal oxide layer(s). The present application also discloses a flexible substrate for solar cells that is inexpensive and which may be produced in a continuous roll-to-roll process. Still further, the present application makes possible the production of flexible solar cells with increased efficiency as to the voltage attained.

These and other objects have been attained in a surprising manner by creating a coated steel product with a metallic strip material having a coating comprising an electrically insulating layer doped with an alkali metal or a mixture of alkali metals. The thermal expansion coefficient of said metallic strip material is less than $12 \times 10^{-6}$ K$^{-1}$ in the temperature range 0-600° C. The electrically insulating layer comprises at least one oxide layer and the oxide layer consists essentially of any of the following dielectric oxides: $Al_2O_3$, $TiO_2$, $HfO_2$, $Ta_2O_5$ and $Nb_2O_5$ or mixtures of these oxides, preferably $Al_2O_3$ and/or $TiO_2$.

Further features of the metallic strip material can include a thickness of 5 to 200 µm, preferably 10 to 100 µm; can include an electrically insulating layer having a multi-layer constitution of 2 to 10 layers, to ensure efficient electrical insulation; can include each individual oxide layer having a thickness of between 0.01 and 2 µm, preferably between 0.1 and 0.5 µm; can include only the layer, or the two layers, most distal from the metallic strip substrate being doped with alkali metal(s); can include the total thickness of the oxide coating being be up to 20 µm, preferably 1 to 5 µm; can include an electrically insulating layer coated by a conducting layer, preferably mainly made of molybdenum; can include a molybdenum layer having a thickness of between 0.01 and 5 µm, preferably 0.1 and 2 µm; can include an alkali metal including Li, Na or K, or mixtures thereof, preferably Na; can include that the individual layers in the multi-layer structure are either made of the same metal oxide or of different metal oxides and that each individual layer is made of one metal oxide or of a mixture of two or more metal oxides; can be used as the substrate material for the production of flexible Cu(In,Ga)Se$_2$ (CIGS) solar cells; and can include electrically insulating layer(s) and electrically conducting layer(s) that are all deposited in a roll-to-roll electronic beam evaporation process.

An exemplary coated steel product comprises a metallic strip material, wherein the metallic strip material has a coating comprising an electrically insulating layer doped with an alkali metal or a mixture of alkali metals, the thermal expansion coefficient of said metallic strip material being less than $12 \times 10^{-6}$ K$^{-1}$ in the temperature range 0-600° C., the electrically insulating layer comprising at least one oxide layer consisting essentially of a dielectric oxide selected from the group consisting of $Al_2O_3$, $TiO_2$, $HfO_2$, $Ta_2O_5$ and $Nb_2O_5$ or mixtures of these oxides.

It is to be understood that both the foregoing general description and the following detailed description are exemplary and explanatory and are intended to provide further explanation of the invention as claimed.

BRIEF DESCRIPTION OF THE DRAWINGS

The following detailed description can be read in connection with the accompanying drawings in which like numerals designate like elements and in which.

DETAILED DESCRIPTION

The above objects and further advantages are achieved by applying a thin continuous, uniform, electrically insulating layer of a metal oxide, such as aluminum oxide, on the top of a metal strip serving as substrate. To the insulating metal oxide a small amount of an alkali metal is added to increase the efficiency of the solar cell. The metal oxide layer should be smooth and dense in order to avoid any pinholes, which may otherwise function as pathways for electrical conduction when the material is further processed. If so desired, and in order to ensure safe electrical insulation from the metal strip substrate, multi-layers (ML) of metal oxides can be deposited. The advantage of an ML structure is that it will exclude any pinholes or conducting pathways through the insulating oxide layer. Furthermore, by depositing a continuous uniform dense metal oxide layer on top of the metallic substrate, it is easier to control the insulating properties as well as the thickness of the metal oxide layer, compared to for instance anodized oxide layers on metallic strips. Moreover, the metal oxide layer will also have an enhanced adhesion to the substrate, in comparison with thermally grown oxide layers. The added alkali metal (primarily sodium) will diffuse into the CIGS layer during the further process steps in the CIGS production. Further, if so required, on top of said metal oxide layer, there may then be deposited a molybdenum layer, this for obtaining a back electrical contact for the production of a thin film flexible solar cell. When several layers of metal oxide(s) are deposited, these layers may be of the same metal oxide or of different metal oxides.

The metal strip to be coated: One of the key issues of the underlying metallic strip is that it should have a low thermal expansion coefficient (TEC) in order to avoid spallation or cracking of the deposited metal oxide layers. Therefore, it is desirable that the TEC of the metallic strip be lower than $12 \times 10^{-6}$ K$^{-1}$ in the temperature range of 0 to 600° C. This will include materials such as ferritic chromium steels, titanium and some nickel alloys. It is also preferred that the material in the metal strip be sufficiently corrosion-resistant to withstand the environment in which the solar cell will work. The physical shape of the metal is in a strip or foil whose thickness should be in the range of 5 to 200 µm, preferably 10 to 100 µm. Another important parameter is the surface roughness of the metal strip, which should be as smooth as possible; a Ra value of less than 0.2 µm is suitable, preferably less than 0.1 µm.

Figure 3:
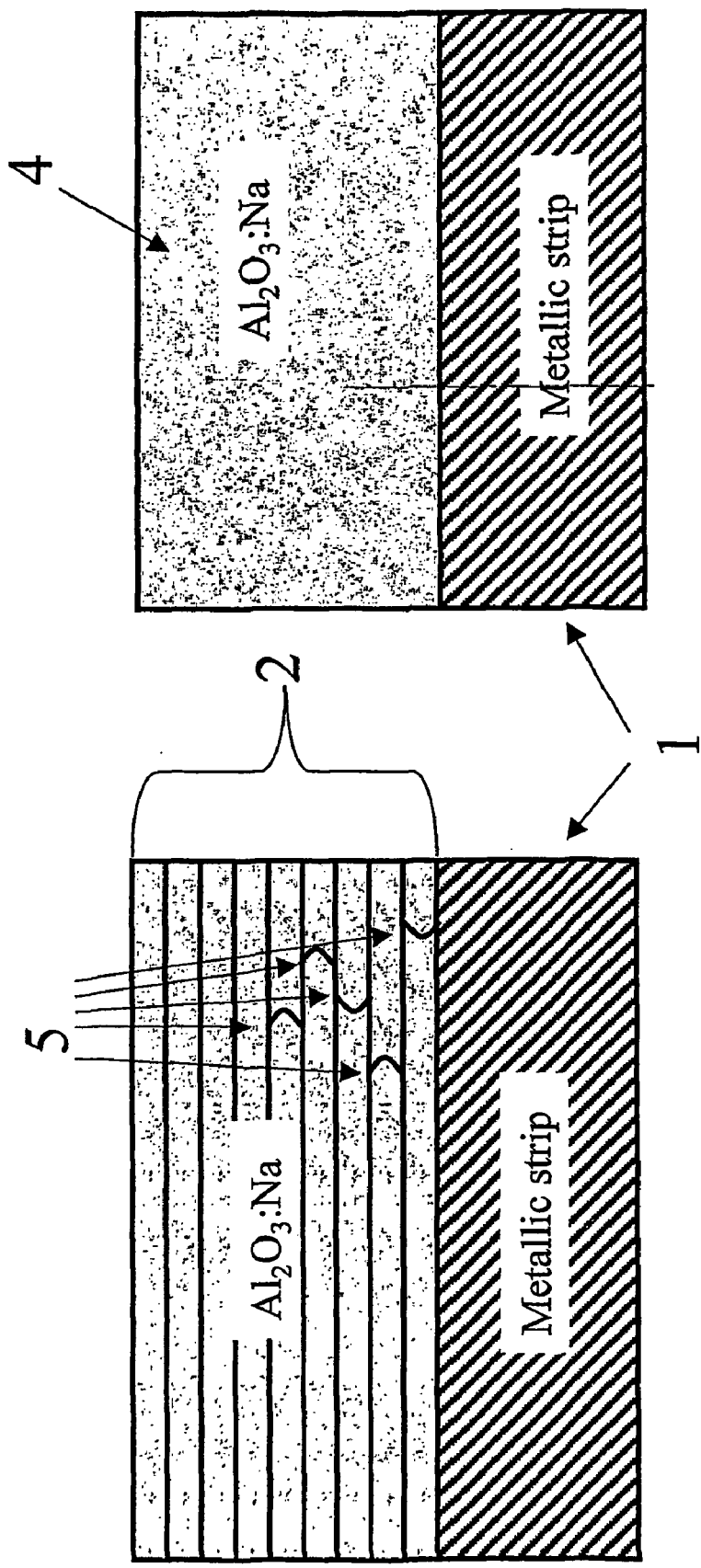
FIG. 3 shows schematic cross-sections of two further embodiments of the disclosed metal strip.

The insulating oxide layer: The electrically insulating oxide layers should adhere well to the metallic strip, in order to ensure highest possible flexibility of the solar cell. This is achieved by careful pre-treatment of the metal strip prior to the coating, first by cleaning it in a proper way to remove oil residues, etc., which may affect the efficiency of the coating process, and the adhesion and quality of the coating. Thereafter, the metal strip is treated by means of an in-line ion assisted etching process. Moreover, the oxide layer should also be a good electrical insulator in order to avoid any electrical connection between the metallic strip and the molybdenum back contact. This can be achieved by depositing dense and smooth oxide layers to bring about better insulating properties, it being repeated that multi-layered structures may also be deposited. The number of individual oxide layers in a multi-layered structure can be 10 or less. As mentioned above, a multi-layered oxide structure will terminate any pinholes or electrical pathways through the overall metal oxide layer and ensure good electrical insulation of the metallic strip. This fact is illustrated in FIG. 3, in which the pinholes are terminated by the adjacent oxide layers. When there are more than one insulating metal oxide layer, then the thickness of each individual oxide layer may be between 10 nm and up to 2 μm, preferably between 0.1 and 1.5 μm. The total thickness of the overall metal oxide layer, both in the case of a single mono layer and multi layers (2 to 10 layers), may be up to 20 μm, preferably 1 to 5 μm. The chemical composition of the oxide layer could be any dielectric oxide such as $Al_2O_3$, $TiO_2$, $HfO_2$, $Ta_2O_5$ and $Nb_2O_5$ or mixtures of these oxides, preferably $TiO_2$ and/or $Al_2O_3$, most preferably $Al_2O_3$, although other oxide layers are feasible, both stoichometric and non-stoichometric ones.

Furthermore, when the metal oxide coating consists of a plurality of layers (multi-layer), then each individual layer may be of the same metal oxide, or of different metal oxides. An individual layer may also consist of a mixture of metal oxides. Moreover, according to the present invention, the oxide layer is doped with an amount of an alkali metal, suitably lithium, sodium or potassium, preferably sodium. The alkali metal concentration in the deposited oxide layer should be between 0.01 and 10% (by weight), preferably 0.1 and 6%, and most preferably 0.2-4%, in order to improve the efficiency of the CIGS solar cell by Na diffusion through the back contact layer in a way similar to the one observed for CIGS deposited on sodalime glass. It is indeed surprising for the skilled man, that the alkali metal in the alkali metal doped oxide layer manages to penetrate through the back contact layer and in a decisive manner influence the performance of the CIGS layer.

When sodium is used, the Na source can be any sodium-containing compound and the Na compound is preferably mixed with the oxide source material prior to the deposition, or the Na can be independently added to the oxide coating in a separate process step. The concentration of Na in the oxide source should be the ones mentioned above. The following Na compounds are useful as Na sources for the oxide layer: Na, $Na_2O$, NaOH, NaF, NaCl, NaI, $Na_2S$, $Na_2Se$, $NaNO_3$ and $Na_2CO_3$, just to list a few.

According to one embodiment of the present invention, when a plurality of metal oxide layers are deposited on the substrate, only the most distal layer, or possibly the two most distal layers, is/are doped with an alkali metal. The reason is of course that mainly this layer or these layers contribute to the diffusion of alkali metal into and past the molybdenum layer and into the CIGS layer in a solar cell.

Description of the back contact layer: Depending upon further processing steps, and on the specific conditions dictated by the individual client, a top layer consisting substantially of molybdenum is applied on top of the oxide layer. This top layer should be dense and adhere well to the underlying, previously deposited oxide layer, while simultaneously allowing the penetration of the alkali metal(s). The thickness of the molybdenum top layer should be 0.01-5.0 μm, preferably 0.1-2.0 μm, most preferably around 0.5 μm.

Description of coating method: Advantageously, the coating method is integrated in a roll-to-roll strip production line. In this roll-to-roll production line, the first production step is an ion-assisted etching of the metallic strip surface, in order to achieve good adhesion of the adjacent insulating oxide layer. The insulating oxide layer is deposited by means of electron beam evaporation (EB) in a roll-to-roll process. This process is well known for the skilled man and is, e.g., comprehensively described in the book Electron Beam Technology by Siegfried Schiller, Ullrich Heisig and Siegfried Panzer, Verlag Technik GmbH Berlin 1995, ISBN 3-341-01153-6, hereby incorporated into the present disclosure by this reference.

The insulating oxide layer may be either a single or mono layer, or a plurality of layers, so called multi layers. While the mono layer usually works satisfactorily, the multi-layer embodiment gives more safety as to cracks and pinholes. The formation of multi-layers can be achieved by integrating several EB deposition chambers in-line (see FIG. 4), or by running the strip several times through the same EB deposition chamber. If a stoichiometric oxide is desired, then the deposition of oxides should be made under reduced pressure with a partial pressure of oxygen as reactive gas in the chamber. In such a production line, the last chamber should be the EB chamber for the deposition of the molybdenum for the back contact layer. The deposition of Mo should be done under reduced atmosphere at a maximum pressure of 1×0-2 mbar.

PREFERRED EMBODIMENT

Firstly, the substrate materials are produced by ordinary metallurgical steelmaking to a chemical composition as described above. They are then hot rolled down to an intermediate size, and thereafter cold-rolled in several steps with a number of recrystallization steps between said rolling steps, until a final thickness of about 0.042 mm and a width of a maximum of 1000 mm. The surface of the substrate material is then cleaned in a proper way to remove all oil residuals from the rolling.

Figure 1:
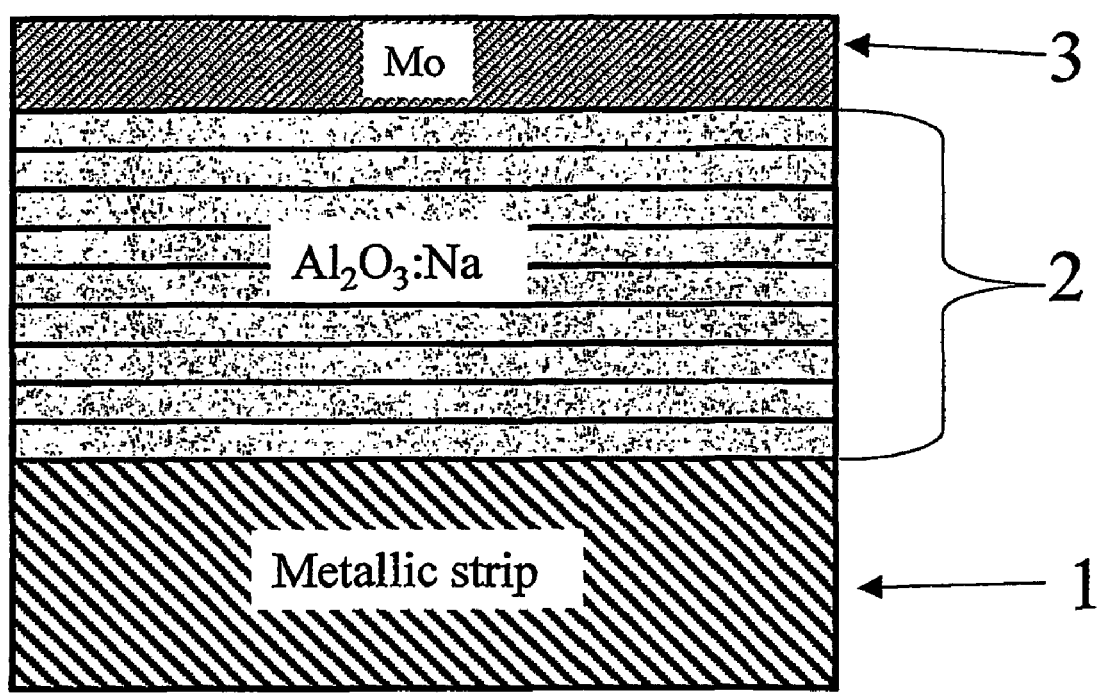
FIG. 1 shows a schematic cross-section of a first embodiment of the disclosed metal strip.

In FIG. 1 a typical cross section of a flexible metallic substrate for the production of thin film CIGS solar cell is illustrated. The substrate material is a flexible metal strip (1), which can consist of stainless steel, or any other metal or alloy which has a TEC lower than $12 \times 10^{-6} K^{-1}$, in the temperature range 0-600° C. The surface roughness of the metallic strip should be kept as low as possible. The thickness of the metallic strip should be in the range of 5-200 μm, preferably 10-100 μm to ensure good flexibility.

Figure 2:
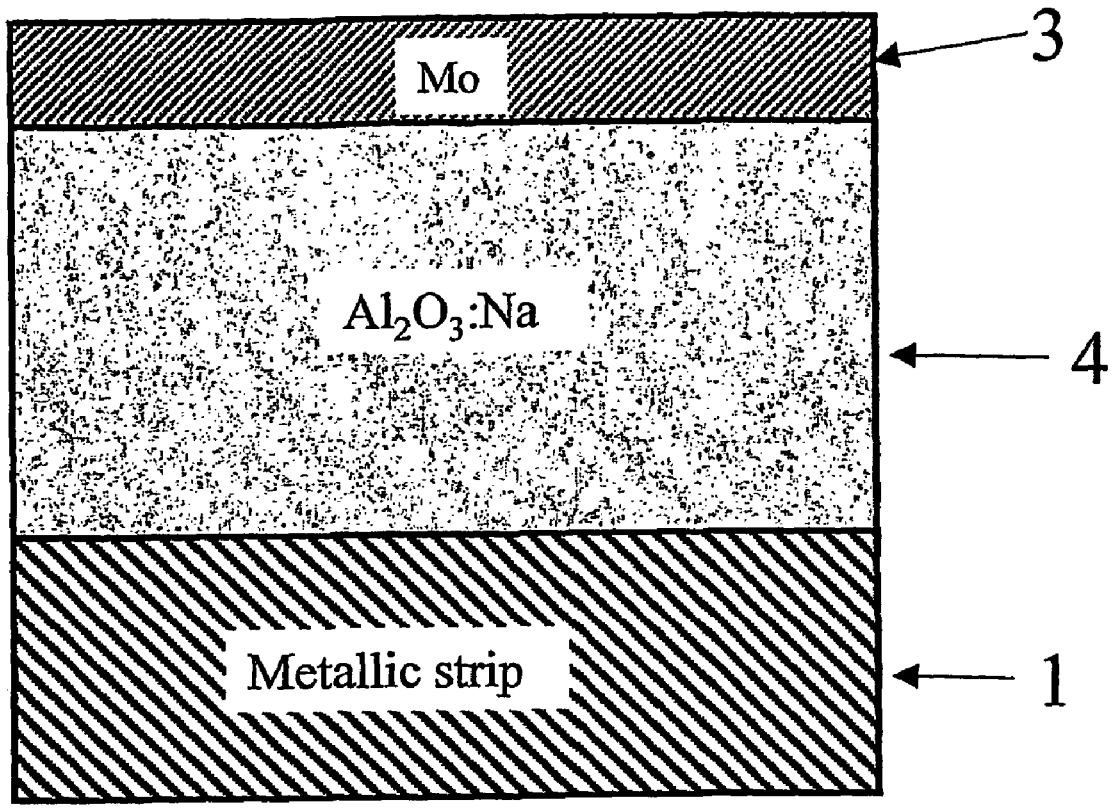
FIG. 2 shows a schematic cross-section of a second embodiment of the disclosed metal strip.

On top of the surface of the metallic strip substrate (1), a single layered alkali metal (in this case sodium) doped aluminum oxide (4) may be deposited in a roll-to-roll EB process, directly on top of the flexible metal strip as illustrated in FIG. 2. On top of the electrically insulated single layered alkali metal doped aluminum oxide, also a molybdenum layer can be deposited by means of electron beam deposition in a roll-to-roll process.

As an alternative to the single or mono layer (4) according to FIG. 2, an electrically insulating aluminum oxide multi-layer structure (2) may be deposited, also by EB deposition in a roll-to-roll process. The aluminum oxide multi-layer structure should be well adherent to the metal strip as well as dense and smooth.

The deposited aluminum oxide is doped with a small amount of alkali metal, preferably sodium. To create a back contact for the CIGS solar cell, a molybdenum layer (3) may be deposited on top of the electrically insulated metallic strip. The molybdenum layer should be dense and well adherent to the metal oxide coating to avoid cracking or spallation. Furthermore, the molybdenum layer should have a thickness between 0.1-5 μm, preferably 0.4-2 μm.

Another variation to the two above-mentioned examples is that no molybdenum back contact layer is deposited on top of the electrically insulating aluminum oxide multi-layer structure (2) or the electrically insulating aluminum oxide single layer (4) deposited by EB deposition in the roll-to-roll process. This is illustrated in FIG. 3. In the figure, the benefit of a multi-layer metal oxide structure is illustrated by the termination of any pinholes (5) and/or electrical pathways (5) through the metal oxide multi-layers.

Figure 4:
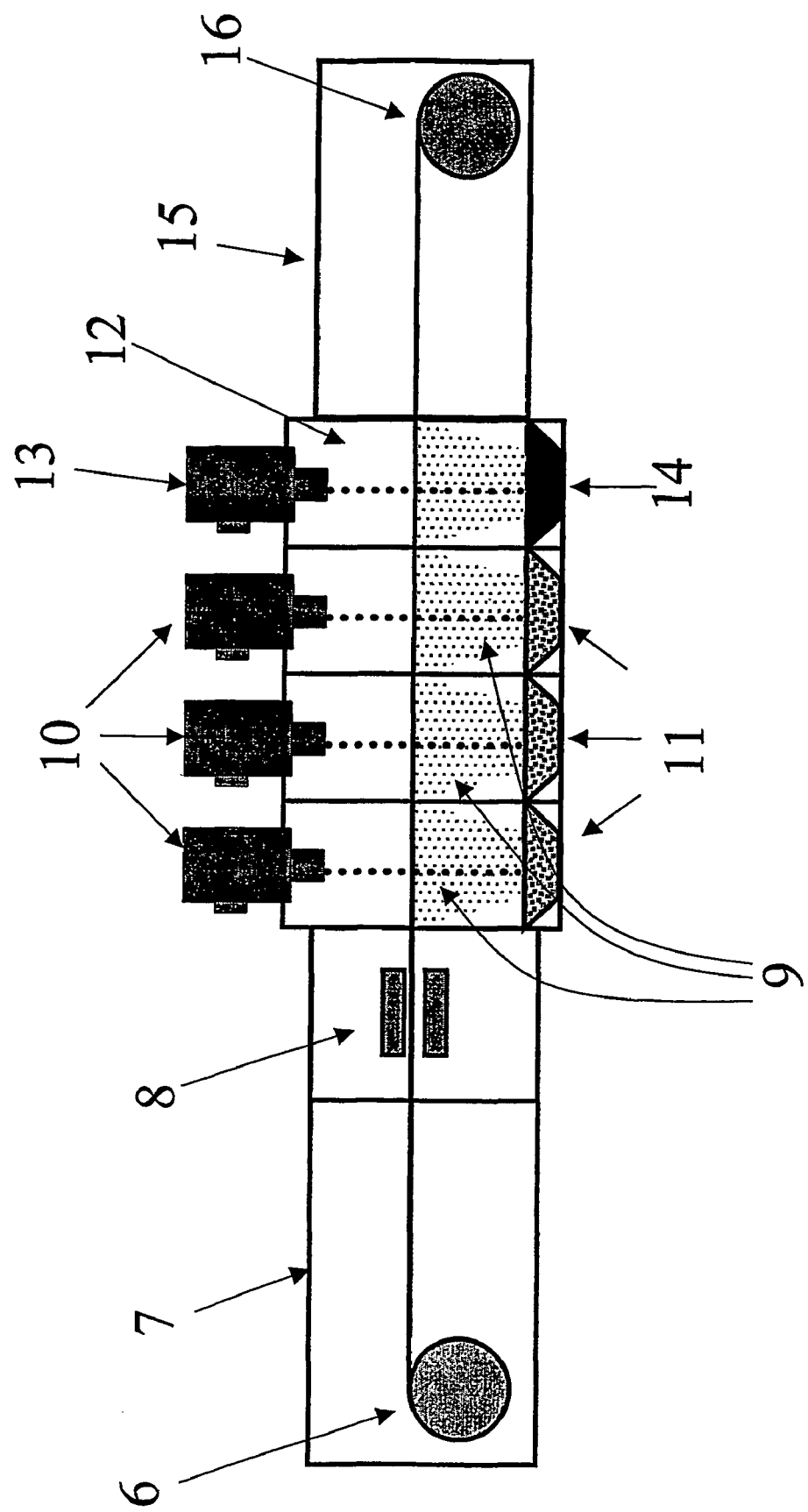
FIG. 4 shows schematically a production line for the manufacturing of a coated metal strip material according to the disclosed method.

The roll-to-roll electron beam evaporation process is illustrated in FIG. 4. The first part of such a production line is the uncoiler (6) within a vacuum chamber (7), then the in-line ion assisted etching chamber (8), followed by a series of EB evaporation chambers (9), the number of EB evaporation chambers needed can vary from 1 up to 10 chambers, this to achieve the wanted multi-layered metal oxide structure. All the metal oxide EB evaporation chambers (9) are equipped with EB guns (10) and water cold copper crucibles (11) for the evaporation. The following chamber is a separate chamber (12) for the EB evaporation of molybdenum top layer, this chamber is also equipped with an EB gun (13) and a crucible (14) for the molybdenum melt. The need for a separate EB evaporation chamber for the molybdenum can be excluded if only metal oxide coated strips are to be produced. After this chamber comes the exit vacuum chamber (15) and the recoiler (16) for the coated strip material, the recoiler being located within vacuum chamber (15). The vacuum chambers 7 and 15 may also be replaced by an entrance vacuum lock system and an exit vacuum lock system, respectively. In the latter case, the uncoiler 6 and the coiler 16 are placed in the open air.

Although described in connection with preferred embodiments thereof, it will be appreciated by those skilled in the art that additions, deletions, modifications, and substitutions not specifically described may be made without department from the spirit and scope of the invention as defined in the appended claims.

The invention claimed is:

1. A coated steel product comprising:
a metallic strip material, the thermal expansion coefficient of said metallic strip material being less than $12 \times 10^{-6}$ $K^{-1}$ in the temperature range 0-600° C.,
wherein the metallic strip material has a coating comprising an electrically insulating oxide layer,
the electrically insulating oxide layer consisting essentially of a dielectric oxide selected from the group consisting of $Al_2O_3$, $TiO_2$, $HfO_2$, $Ta_2O_5$ and $Nb_2O_5$ or mixtures of these oxides doped with an alkali metal or a mixture of alkali metals.

2. Coated steel product according to claim 1, wherein the metallic strip material has a thickness of 5 to 200 μm.

3. Coated steel product according to claim 1, wherein, characterized in that the electrically insulating oxide layer has a multi-layer constitution of 2 to 10 sublayers.

4. Coated steel product according to claim 3, each individual oxide sublayer has a thickness of between 0.01 and 2 μm.

5. Coated steel product according to claim 3, wherein only the sublayer, or the two sublayers, most distal from the metallic strip substrate is/are are doped with alkali metal(s).

6. Coated steel product according to claim 1, wherein a total thickness of the electrically insulating oxide layer is up to 20 μm.

7. Coated steel product according to claim 1, wherein the electrically insulating layer is coated by a conducting layer.

8. Coated steel product according to claim 7, wherein the conducting layer is made mainly from molybdenum and the conducting layer has a thickness of between 0.01 and 5 μm.

9. Coated steel product according to claim 1, wherein the alkali metal is Li, Na or K, or mixtures thereof.

10. Coated steel product according to claim 3, wherein the individual sublayers in the multi-layer structure are either made of the same metal oxide or of different metal oxides and that each individual layer is made of one metal oxide or of a mixture of two or more metal oxides.

11. Coated steel product according to claim 1, wherein the coated steel product is suitable as a substrate material for the production of flexible $Cu(In,Ga)Se_2$ (CIGS) solar cells.

12. Method for producing a coated steel product according to claim 1, wherein the electrically insulating oxide layer(s) and at least one electrically conducting layer(s) are all deposited in a roll-to-roll electronic beam evaporation process.

13. A flexible $Cu(In,Ga)Se_2$ (CIGS) solar cell comprising a coated steel product according to claim 1.

14. Coated steel product according to claim 1, wherein the dielectric oxide is $Al_2O_3$ or $TiO_2$.

15. Coated steel product according to claim 2, wherein the thickness of the metallic strip material is 10 to 100 μm.

16. Coated steel product according to claim 1, wherein the electrically insulating oxide layer has a multi-layer constitution with an electrically insulating effective number of sublayers.

17. Coated steel product according to claim 4, wherein the thickness of each individual oxide sublayer is between 0.1 and 1.5 μm.

18. Coated steel product according to claim 6, wherein the total thickness of the electrically insulating oxide layer is 1 to 5 μm.

19. Coated steel product according to claim 7, wherein the conducting layer is mainly made of molybdenum.

20. Coated steel product according to claim 8, wherein the thickness of the conducting layer is between 0.1 and 2 μm.

21. Coated steel product according to claim 9, wherein the alkali metal is Na.

* * * * *